CIRCUIT BOARD

Original Filed May 2, 1966 3 Sheets-Sheet 1

INVENTOR.
ALBERT E. PRATHER
BY Anthony D. Cennamo
Paul W. Fish
ATTORNEYS

Dec. 23, 1969 A. E. PRATHER 3,485,934

CIRCUIT BOARD

Original Filed May 2, 1966 3 Sheets-Sheet 2

INVENTOR.
ALBERT E. PRATHER
BY Anthony O. Cennamo
Paul W. Fish
ATTORNEYS

Dec. 23, 1969 A. E. PRATHER 3,485,934

CIRCUIT BOARD

Original Filed May 2, 1966 3 Sheets-Sheet 3

INVENTOR.
ALBERT E. PRATHER
BY Anthony D. Cennamo
Paul W. Fish
ATTORNEYS

United States Patent Office 3,485,934
Patented Dec. 23, 1969

3,485,934

CIRCUIT BOARD

Albert E. Prather, Sodus, N.Y., assignor to Xerox Corporation, Rochester, N.Y., a corporation of New York Original application May 2, 1966, Ser. No. 547,049. Divided and this application Oct. 31, 1968, Ser. No. 797,716
Int. Cl. H05k *1/02;* H02b *1/02*
U.S. Cl. 174—68.5 2 Claims

ABSTRACT OF THE DISCLOSURE

A circuit board composed of compactly arranged novel conductive patterns on the surfaces of a dialectric base member and designed for utilization in a variety of alternative situations.

This application is a division of application, Ser. No. 547,049 filed May 2, 1966, now abandoned.

This invention relates generally to circuit boards. More specifically, the invention relates to a double-cladded circuit board having universal utility.

Double-cladded circuit boards are well known in the art as being useful in forming breadboard circuits at various stages of research development. In the past however, there has been a need for a universal or standard circuit board which could be taken from inventory, for example, and used to accommodate almost any breadboard circuit configuration by merely making various interconnections from one side of the board to the other and mounting the desired circuit modules directly on the board. A feature of obvious desirability is that of having a board so designed as to necessitate the minimum of alterations thereto, i.e., cutting conductors and making interconnections, and to facilitate quick and reliable interconnections while still permitting a myriad of circuits to be configured on its surfaces. This feature has been absent in the prior art boards.

Many such prior art boards require additional conductors exterior to the board to connect various points of the board while others necessitated undesirable weld-through methods making necessary interconnections slow and expensive as well as cumbersome. For example, in one method holes are drilled through a dielectric base member to accommodate a terminal of a component or circuit module to be welded to a point on a conductor on the side of the base member opposite the circuit module or component. In other instances, these holes are drilled to connect two specific conductor points on each side of the base member. Any misregistration of the drilled hole created an undesirably discontinuous electrical connection.

Another prior art technique utilizes the cold flow characteristics of the dielectric base member by forcing the desired portions of two conductors on each side of the member toward each other thereby physically excluding the dielectric material between these portions. This force is applied until these desired portions are in physical contact with each other at which time a weld pulse is then applied thereby welding these portions together to form an interconnection through the dielectric material. This method has the disadvantages of requiring a very large force on the conductors which could damage the entire board, and in addition, is limited to dielectrics with precise cold flow properties and to circuit boards which use circular or elliptical conductors. The more easily fabricated etched boards do not lend themselves readily to this interconnecting method since the flat or ribbon-like conductors would require a damagingly excessive force to urge such conductors into contact relying on the cold flow properties of the base member.

Still another technique for interconnecting two conductors on a circuit board through a dielectric base member is the use of electrical energy to create an arc which is sufficient to break down the dielectric material thereby forming a hole therein through which an interconnection between the conductors may be made. By this method the arc melts the metal of the conductive patterns at the point of interconnection and this molten metal flows into the hole formed by the breakdown thereby completing the weld. This technique has the disadvantages of requiring a very high voltage to provide the arc necessary for breakdown.

Therefore, it is an object of this invention to provide an improved method for forming interconnections on a printed circuit board without the deficiencies of the aforementioned prior art methods.

A still further object of the invention is to provide an improved method of making reliable interconnections on a printed circuit board in a minimum of time and cost.

Another object of this invention is to provide an improved circuit board which has universal applications for a very large number of circuit configurations.

Still another object of the invention is to provide an improved circuit board having conductors arranged thereon in an extremely compact pattern and designed for convenient utilization in a variety of alternative situations.

A further object of the invention is to provide an improved circuit board which does not require extensive alteration for each modification or change in the electric circuit which it carries.

These and other objects of the invention are obtained from a circuit board composed of compactly arranged novel conductive patterns on the surfaces of a dielectric base member and by the means of the method of the present invention which includes heating a non-conductive layer separating two conductive patterns on opposite surfaces thereof and urging two portions of the conductive patterns into contact while the contact area is continuously heated until a weld of these portions is completed.

Other features and objects of the invention will be found throughout the more detailed description of the invention which follows. To more clearly portray the invention and its manner of operation the description is supplemented with the accompanying drawings in which.

Figure 1:
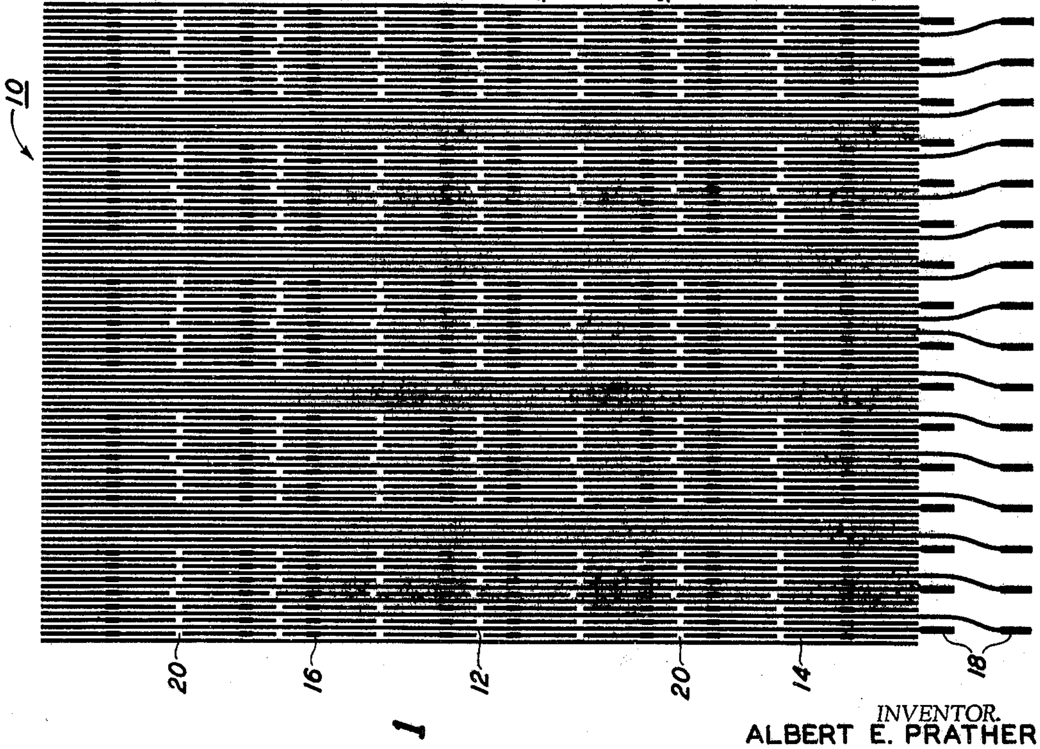
FIG. 1 is an illustration of one conductive pattern of the circuit board in accordance with the present invention.

FIGURE 1 shows an array 10 of conductors which constitutes one of the conductive patterns applied to the surface of a non-conductive layer to be referred to in more detail hereinafter. This array is made up of two different conductors, i.e., conductors such as conductor 12 which is continuous along its entire length from one side to the other side of the array and conductor 14 which is parallel to conductors 12 and is discontinuous at several points along its length. The discontinuous conductor 14 is also characterized by pads or wide conductive portions 16 which are interposed along its length at predetermined positions. As may be evident from FIG. 1, the continuous conductors 12 and discontinuous conductors 14 constituting the array 10 occur in an alternating pattern forming a set of conductors which is repeated several times across the width of the array 10, i.e., its shorter dimension. Separating these sets is another set of parallel, continuous conductors 12. At one end of the array numerous conductive tabs 18 are connected to selective ones of the continuous conductors 12. These tabs 18 are used as terminals for connecting selected points of the circuit mounted on the circuit board to suitable bias potentials. The peculiar positioning of the discontinuities 20 in the conductors 14 will be explained in more detail hereinafter.

Figure 2:
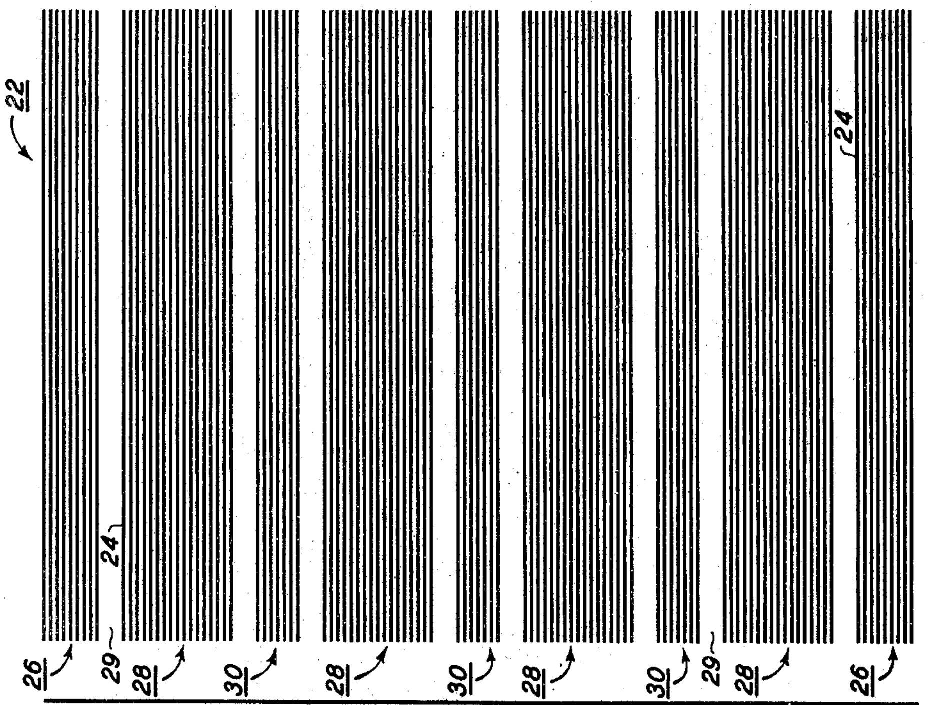
FIG. 2 is an illustration of another conductive pattern in accordance with the present invention.

In FIG. 2 there is shown an array 22 of conductors constituting another conductive pattern which is applied to one surface of a non-conductive material or layer opposite the surface upon which is applied the conductive pattern as shown in FIG. 1. The conductive pattern of FIG. 2 is made up of only continuous parallel conductors 24, the length of which correspond to the width of the array 22. As may be seen in this figure, after a plurality 26 of conductors 24 there is an alternating pattern of sets 28 and 30 of conductors. Intermediate these sets there are spacings 29 which will be explained in more detail hereinafter.

The conductors shown in FIGS. 1 and 2 may in the preferred embodiment be composed of nickel or nickel plated copper. The choice of these materials as well as other suitable materials will be explained in more detail in connection with the method of welding these conductors.

Figures 3, 4:
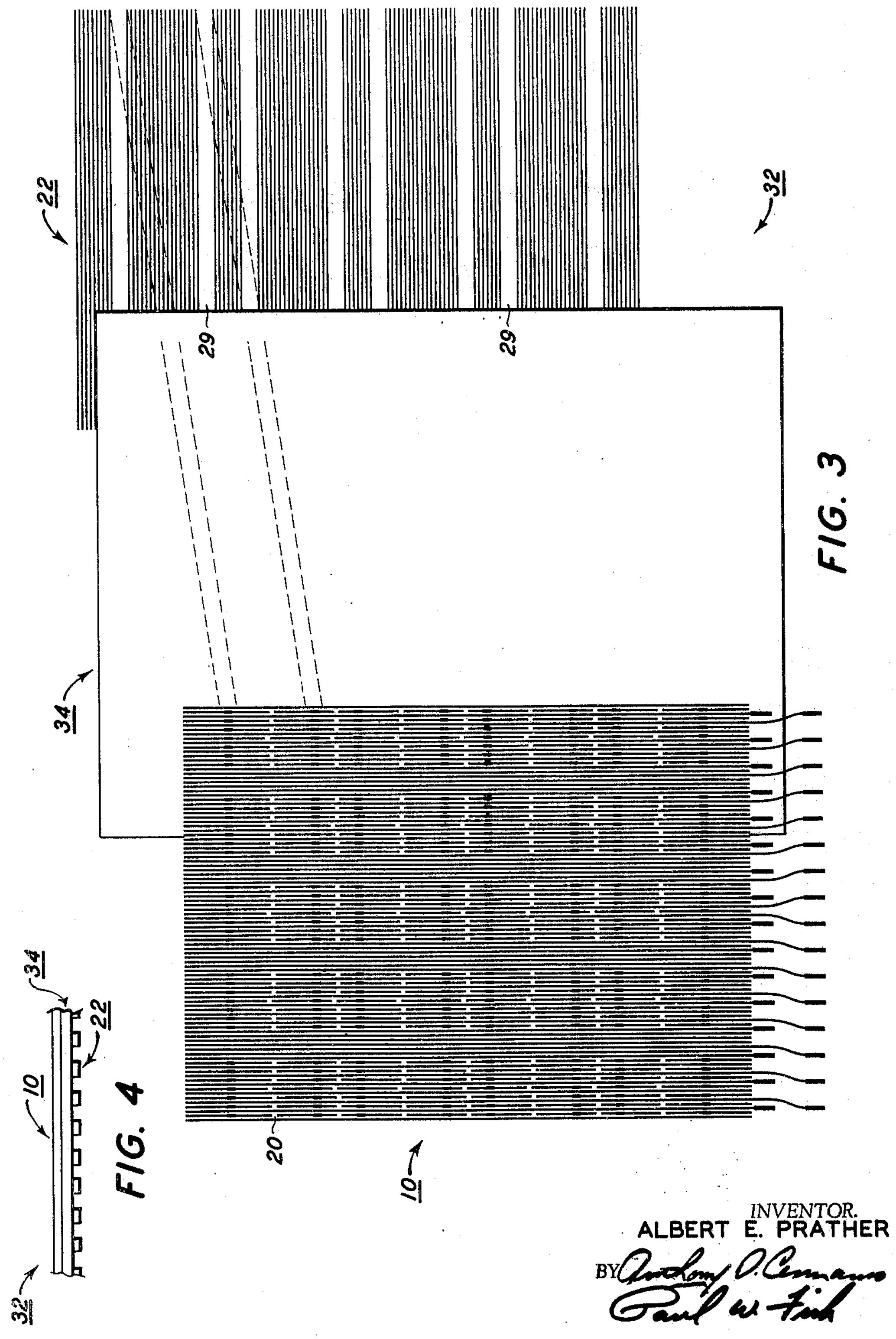
FIG. 3 illustrates in an exploded view the circuit board in accordance with the present invention.
FIG. 4 is a cross-sectional illustration of a portion of the circuit board in accordance with the present invention.

FIGURE 3 illustrates a preferred embodiment of the circuit board 32 in an exploded view showing the conductive pattern 10 of FIG. 1 on one side of a non-conductive or dielectric sheet or layer 34 with the conductive array 22 of FIG. 2 on the other side thereof. It will be noted in this figure that the conductors on opposite sides of the dielectric member 34 lie in parallel planes, but at right angles to each other. However, it will be recognized by those skilled in the art that these conductors may be placed at some angles other than a right angle, or even may be placed in parallel relation to each other within the teachings of this invention.

The circuit board of the preferred embodiment as illustrated in FIG. 3 could be made by, first cladding both sides of a dielectric member, for example, member 34, with two layers of suitable conductive material. The surfaces of these two layers are then coated with a suitable photo-resist material which is exposed by suitable illumination focused through the desired photographic negative corresponding to the particular conductive array. The double-cladded dielectric member is then subjected to a suitable etching bath which removes those areas of the photo-resist layers, and corresponding conductive material, which were not exposed to the illumination as well as all other photo-resist material thereby leaving a dielectric member having the desired conductive arrays continguous with its surfaces.

Referring still to the exploded illustration of FIG. 3 it will be noted that the spacing 29 between the conductor groups of the conductive array 22 are in alignment with the pads 16 of the conductors 14 of the conductive array 10. The discontinuities 20 of the conductors 14 in the conductive array 10 are in alignment with the sets 28 and 30 of conductors 24 of the array 22. These discontinuities prevent a short circuit between pads 16 of the same conductor thereby electrically isolating these pads. By off-setting one discontinuity in each group of discontinuities, access to the corresponding conductor 24 in the array 22 on the other side of the dielectric member 34 is possible permitting any one of several pads 16 to be connected to this conductor.

FIGURE 4 represents a cross-sectional view of a portion of the circuit board in accordance with this invention. This figure illustrates the relationship between the conductive array 10 and the conductive array 22 as they appear in a completed circuit board with respect to the dielectric member 34. It should be understood that the thickness of the conductors and the dielectric member have been exaggerated for the purposes of this illustration in the interest of clarity. In the preferred embodiment, the thickness of the conductors may be approximately 2 mils while the dielectric layer 34 may have a thickness of approximately 3 mils. The width of the conductors in the preferred embodiment may be approximately 12.5 mils with a similar spacing between these conductors.

Figure 5:
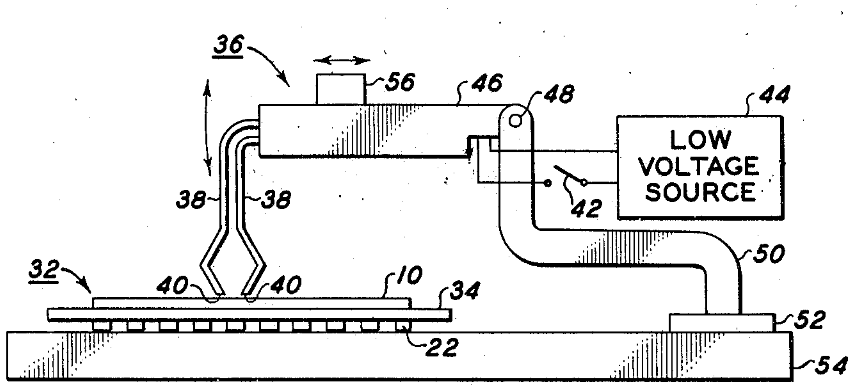
FIG. 5 illustrates a preferred embodiment of the manner in which the method of the present invention may be carried out; and, FIG. 6 illustrates a portion of the conductive pattern of FIG. 1 showing an integrated circuit module mounted thereon.

Reference is now made to FIG. 5 which shows a circuit board 32 in position to have interconnections between arrays 10 and 22 made through the use of the apparatus generally designated 36. This apparatus may be referred to as a parallel gap welder and can include two welding electrodes 38 having electrode tips 40. These electrodes 38 are connected through a switch 42, for example, to a source 44 of low voltage which may be variable over a range of 0.5 to 1.5 volts, for example, depending on the material of the conductive arrays and member 34. The electrodes 38 are supported by an arm member 46 which is movably attached by hinge 48 to a support member 50 mounted in a rotatable fashion by a swivel 52 to a base member 54 which is used for supporting the circuit board to be operated on. The base member 54 may be made of a suitable ceramic or other dielectric material. Supported also by arm member 46 is a suitable weight 56 which is slidable along the arm member 46 to increase or decrease the pressure forcing the electrodes 38 toward the base member 54. This slidable relationship is symbolically denoted by the double headed arrow (not numbered). It is understood that the swivel 52 may be positioned in a channel, for example, to permit movement of the support member 50 in such a direction as to be in the plane of the drawing as shown. This would make every portion of the circuit board as positioned on the base member 54 accessible to the electrodes 38.

The novel method of forming interconnections between arrays 10 and 22 will now be described with reference to FIG. 5. The desired portion of a conductor in the conductive array 10 is chosen and the gap between the electrode tips 40 is positioned directly thereover. This portion would also correspond to a portion of a conductor in the conductive array 22 on the other side of the dielectric member 34, the desired interconnection being between these two portions. The arm member 46 would then be moved urging each of the electrode tips 40 into physical, electrical contact on each side of the desired portion of of the conductive array 10. Once this contact is established, current would commence to flow from the low voltage source 44 through a path consisting of switch 42, electrode 38, that portion of the conductive array 10 between the electrode tips 40, the other electrode 38, and back to the low voltage source 44. This current flow would generate a predetermined amount of heat determined by the resistance of this portion of the conductor as well as the voltage value of the low voltage source 44. For this reason, the material of the conductors in the arrays of this circuit board are desirably of a material which has a suitable resistivity constant.

As noted before, nickel may be used for these conductors or nickel-cladded copper may also be used. Therefore, the choice of materials for the conductors in the arrays 10 and 22 may be selected from a wide range of conductive material. However, depending upon the resistivity constant of the material selected, a corresponding increase or decrease in the voltage value of the low voltage source 44 may be made to insure the appropriate degree of heat generation at that portion of the conductor between the electrode tips 40.

The heat generated by the current flow through this portion of the array will tend to soften the dielectric material 34 directly beneath this portion and that area of this material closely adjacent this portion. Since the pressure applied by the electrode tips 40 on that portion of the array 10 is continuous throughout this heating period, as the dielectric member 34 is selectively softened, that portion of the conductor passing current will be urged toward a corresponding portion of the conductive array 22 on the other side of the dielectric member 34.

It should be noted that the amount of force supplied by slidable weight 56 on the arm member 46 is adjusted to provide only that force sufficient to urge the desired portions of the arrays into physical contact. In the preferred embodiment utilizing nickel conductors and a dielectric member of Mylar, this force was approximately 1 to 2 pounds. The amount of force required to achieve the proper contact of the conductors is dependent upon the thickness of the conductors and the dielectric member and the material thereof as well as the degree to which the dielectric member has been softened by the heat generated by the passing current in the desired portion of the array 10. As the heating continues and the softening increases, physical contact between these two portions will be achieved and at this point the bottom conductor will be heated through the conduction of heat from the portion of the array 10 passing current. This heat will be sufficient to form a solid weld between these two portions thereby creating the desired interconnection. After the interconnection is made, the electrode tips 40 are removed from contact with the circuit board 32 and are then ready to perform another welding operation.

It will be realized that the time during which force and heat are applied to the circuit board will be determined not only by the voltage value of the source 44 and the amount of pressure applied by the weight 56, but also the temperature characteristics of the dielectric material 34. If this material has a high temperature characteristic, a longer period of heat and force may be necessary while a low temperature characteristic will necessitate a shorter heating and pressure time.

In forming the interconnections and circuits on the printed circuit board 32, it may be desirable to selectively provide a discontinuity in one of the conductors of the conductive array 10 at some point other than where those discontinuities already present in this array occur. This may be done by following the same steps as outlined previously in forming an interconnection but with the difference that the voltage applied across the electrode tips 40 is at a substantially higher value. In this manner, the current flow through that portion of the conductor at which a discontinuity is desired is of such a value that this portion will be heated much more rapidly and more intensely than in the case of an interconnection. This rapid and intense heating of this portion of the conductor acts to physically remove this portion of the conductor from the surface of the dielectric member 34. It is believed that this increased and rapid heat acts in part to vaporize some of the conductor as well as to cause the conductor material to melt and expand so rapidly as to remove itself from the position it once occupied on the dielectric member 34. Since this heating is so rapid, that area of the dielectric member 34 directly beneath this portion of the conductor and adjacent thereto is not heated sufficiently to cause any significant deformation of this dielectric member 34. Therefore, in this manner a discontinuity of a conductor in the array 10 may be provided without substantially affecting the remainder of the circuit board. It is also necessary to point out that in the instance when a discontinuity is to be formed by the apparatus of FIG. 5, the force applied by the electrode tips 40 on the desired conductor may be in an amount necessary only to achieve good electrical contact with this conductor.

The parallel gap electrodes 38 may be of any conventional design but it is preferable to limit the size of the electrode tips 40. These tips should not be of a dimension such that when the electrode tips 40 are centered on a conductor they physically contact an adjacent conductor. This insures that there will be no undesirable heating of the dielectric material 34. However, it is understood that the size of the electrode tips 40 should be sufficient to permit a good electrical contact with the conductors and should be preferably slightly larger than the width of the conductors used.

The non-conductive member 34 may be of any suitable material having a temperature characteristic such that the material will soften at a particular temperature which is lower than the weld temperature for the material constituting the conductors. An example of such a material is Mylar which has a melting temperature of approximately 250 degrees centigrade. This material is compatible with a conductor material such as nickel which has a weld temperature of approximately 1455 degrees centigrade. Although there appears to be a great disparity between the melting temperature of the dielectric material and the weld temperature of the conductor, it is believed that the surrounding dielectric material acts as a heat sink and absorbs a substantial amount of the heat generated in that portion of the conductor passing current such that the melting temperature of the dielectric material is not reached immediately but after a certain period of time before the weld temperature of the conductor material is reached. By a proper selection of materials, the dielectric material will not be excessively heated before contact between the desired portions of the conductive arrays is achieved.

Figure 6:
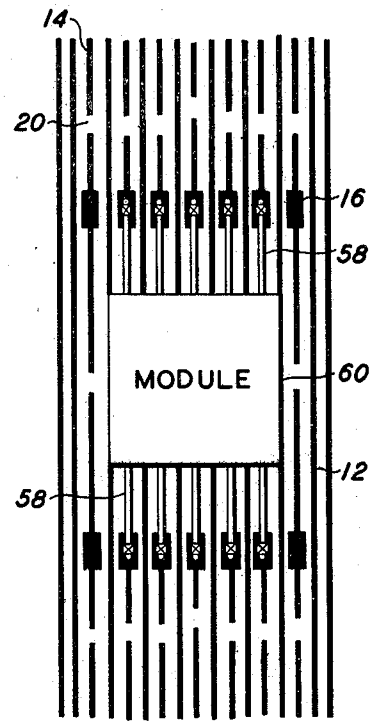

FIGURE 6 illustrates the function of the conductive pads 16 which are interposed along the length of the conductors 14 in the conductive array 10. These pads 16 provide a suitable area upon which the terminals of an integrated circuit module, for example, may be welded. As seen in the illustration of FIG. 6 a typical integrated circuit module 60 may have as many as ten output terminals 58 which must be connected into the circuit which is to be formed on the circuit board 32. The spacing of the pads 16 as seen in FIG. 3 with reference to the array 10 are such as to accommodate a typical integrated circuit module 60 and its terminals 58.

In order to permit as much flexibility and utility to the circuit board the discontinuities 20 in the array 10 have been made as small as possible yet large enough to permit effective electrical isolation of the pad 16. In this manner the pads have a portion of a conductor extending from both sides thereof to permit an interconnection from this portion of a conductor through the dielectric member 34 to any desired conductor 24 in the array 22.

It should be noted that the spacing 29 between sets 28 and 30 of conductors 24 in the conductive array 22 are such as to permit the absence of any conductor directly in alignment with the pads 16 in the conductive array 22. This renders impossible any accidental welding of a pad 16 through the non-conductive layer 34 to a conductor 24 in the conductive array 22. This may happen if too much heat is used when an output terminal of a module is welded to one of the conductive pads 16.

If desired, the entire circuit board as shown in FIGURE 3 may be encapsulated in a mold of insulating material and placed on an insulative stiffener member which will provide the necessary rigidity to the circuit board to facilitate subsequent handling of the board.

This encapsulation of the circuit board facilitates its use in a complete electronic apparatus requiring a plurality of sub-assemblies or circuits. It will be noted that the circuit board lends itself to being arranged one on top of the other or a side by side arrangement or in cylindrical configurations. While these types of applications for the encapsulated circuit boards of this invention are useful and have definite advantages, it is to be understood that other arrangements of the assemblies can be made within the teachings of this invention.

While the invention has been described with reference to the embodiments disclosed herein, it is not confined to the details set forth since it is apparent that certain electrical and mechanical equivalents may be substituted in the preferred embodiments without departing from the scope of the invention. Thus, for example, although a particular apparatus is disclosed in reference to FIG. 5 it should be understood that any parallel gap welding apparatus may be used to form the interconnections on the printed circuit board. In addition while the low voltage source 44 and the switch 42 do not indicate a variation in voltage during the welding process, it is contemplated that this voltage may be selectively varied during the welding step, i.e., one amplitude voltage may be used for the preliminary heating and a second amplitude voltage may be used for the actual welding of the two conductors.

It is also readily understood that while the method in accordance with the present invention has been described as being performed manually, the actual welding of interconnections on a typical circuit board may be done automatically through the use of a programmed welder.

Again with reference to FIG. 5, while the welding apparatus is illustrated as being adjacent the conductive array 10, the novel welding method is also applicable from that side of the dielectric member 34 adjacent the conductive array 22. It should be understood however, that the welder must be on that side of the dielectric member on which the circuit components are to be mounted in order to weld these components to the circuit board.

Another modification of the circuit board as disclosed is the use of conductive ribbons adhered to the dielectric member 34 by suitable adhesive or the use of discrete, circular, wire-like conductors in place of the etched conductors or adhered ribbons.

It is also understood that while the current passing through a desired portion of a conductor in the array 10 produces the necessary heat to soften the dielectric member 34, it would be possible within the concept of the present invention to heat the dielectric member 34 in the area of the desired weld by other suitable means, for example, ultrasonics or selectively positionable heater filaments.

What is claimed is:

1. A universal circuit board comprising:

(a) a dielectric member having two dimensions defining an area and having first and second surfaces coextensive with said area;

(b) a first array of parallel conductors contiguous with said first surface;

(c) a second array of parallel conductors contiguous with said second surface;

(d) said first array including two sets of conductors;

(1) one of said sets including alternating electrically continuous and discontinuous conductors being continuous over one dimension of said array and each of said discontinuous conductors having a like plurality of electrical discontinuities along its length and a like plurality of conductive portions having a width greater than the width of said discontinuous conductor each interposed between consecutive discontinuities, each conductive portion of each of said discontinuous conductors being in spatial alignment with an associated conductive portion in the other discontinuous conductors;

(2) the other of said sets including continuous conductors electrically continuous over said one dimension; and, (3) said two sets occurring alternatingly across said array over another dimension thereof;

(e) said second array of conductors including spaced apart groups of continuous parallel conductors wherein the spacing between adjacent groups is so oriented relative to said conductive portions of said first array that a line normal to any of said conductive portions and said first surface and passing through any point of said conductive portion will pass through the spacing intermediate adjacent groups of conductors of said second array; and, (f) said conductors of said first array and said second array positioned at an angle with respect to each other.

2. A circuit board according to claim 1 wherein:

(a) at least one of said discontinuous conductors has its discontinuities offset in said one dimension from the discontinuities in the other discontinuous conductors in said one of said sets; and, (b) the distance between consecutive conductive portions of each discontinuous conductor is substantially greater than the distance of the discontinuity between said consecutive conductive portions.

References Cited

UNITED STATES PATENTS

| | | | |
|---|---|---|---|
| 2,914,706 | 11/1959 | Hill et al. | |
| 3,185,761 | 5/1965 | McHugh | 174—68.5 |
| 3,300,851 | 1/1967 | Lodder | 29—626 XR |

DARRELL L. CLAY, Primary Examiner

U.S. CL. X.R.

29—625; 219—117; 317—101; 339—18

PO-1050
(5/69)

UNITED STATES PATENT OFFICE
CERTIFICATE OF CORRECTION

Patent No. 3,485,934 Dated December 23, 1969

Inventor(s) Albert E. Prather

It is certified that error appears in the above-identified patent and that said Letters Patent are hereby corrected as shown below:

Column 1 line 15, delete "dialectric" andinsert therefore dielectric--. Column 8, line 6, before the term "being" insert the phrase--, said continuous conductors--.

SIGNED AND SEALED
MAY 12 1970

(SEAL)
Attest:

Edward M. Fletcher, Jr.
Attesting Officer

WILLIAM E. SCHUYLER, JR.
Commissioner of Patents